United States Patent [19]
Yonemizu et al.

[11] Patent Number: 5,882,426
[45] Date of Patent: Mar. 16, 1999

[54] METHOD OF CLEANING A SUBSTRATE BY SCRUBBING

[75] Inventors: Akira Yonemizu; Nobukazu Ishizaka, both of Kumamoto; Tomoko Hamada, Kikuchi-gun, all of Japan

[73] Assignees: Tokyo Electron Limited, Tokyo; Tokyo Electron Kyushu Limited, Tosu, both of Japan

[21] Appl. No.: 798,342

[22] Filed: Feb. 10, 1997

Related U.S. Application Data

[62] Division of Ser. No. 439,570, May 11, 1995, Pat. No. 5,636,401.

[30] Foreign Application Priority Data

May 12, 1994 [JP] Japan .................................. 6-122954

[51] Int. Cl.$^6$ ...................................................... B08B 7/04
[52] U.S. Cl. ................................... 134/6; 134/7; 134/32; 134/33
[58] Field of Search ............................... 134/6, 7, 32, 33; 15/21.1, 77, 88.2, 97.1, 102

[56] References Cited

U.S. PATENT DOCUMENTS

| | | | |
|---|---|---|---|
| 4,382,308 | 5/1983 | Curcio | 15/77 |
| 4,476,601 | 10/1984 | Oka | 15/77 |
| 5,144,711 | 9/1992 | Gill, Jr. | 15/77 |
| 5,282,289 | 2/1994 | Hasegawa | 15/88.2 |
| 5,351,360 | 10/1994 | Suzuki | 15/77 |
| 5,375,291 | 12/1994 | Tateyama | 15/88.3 |
| 5,421,056 | 6/1995 | Tateyama | 15/77 |
| 5,475,889 | 12/1995 | Thrasher | 15/77 |
| 5,485,644 | 1/1996 | Shinbara | 15/21.1 |
| 5,498,294 | 3/1996 | Matsushita et al. | 134/6 |
| 5,551,986 | 9/1996 | Jain | 134/6 |

FOREIGN PATENT DOCUMENTS

| | | |
|---|---|---|
| 0112625 | 6/1984 | Japan . |
| 0193029 | 11/1984 | Japan . |
| 0016626 | 1/1988 | Japan . |
| 0239953 | 10/1988 | Japan . |
| 1289122 | 11/1989 | Japan . |
| 3-52228 | 3/1991 | Japan . |

*Primary Examiner*—Lyle A. Alexander
*Assistant Examiner*—Saeed Chaudhry
*Attorney, Agent, or Firm*—Oblon, Spivak, McClelland, Maier, & Neustadt, P.C.

[57] ABSTRACT

The present invention provides a cleaning method in which an object to be cleaned is held such that a surface of the object to be cleaned faces a cleaning body and the object to be cleaned and the cleaning body are moved relative to each other in a state where the cleaning body is in contact with the surface to the object to be cleaned, thereby cleaning the surface of the object to be cleaned, wherein a contact pressure of the cleaning body to the surface of the object to be cleaned is set at most 20 gf/cm$^2$, when the surface is cleaned.

5 Claims, 5 Drawing Sheets

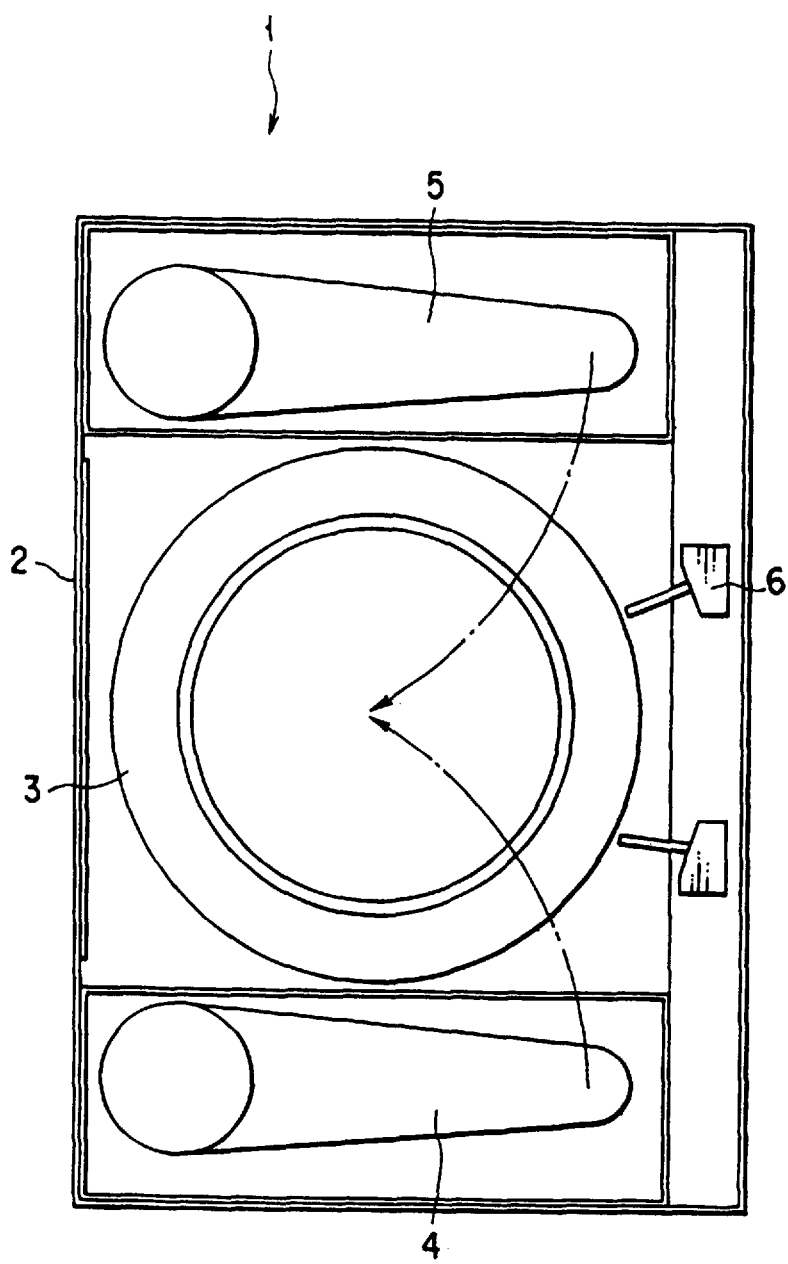
F I G. 1

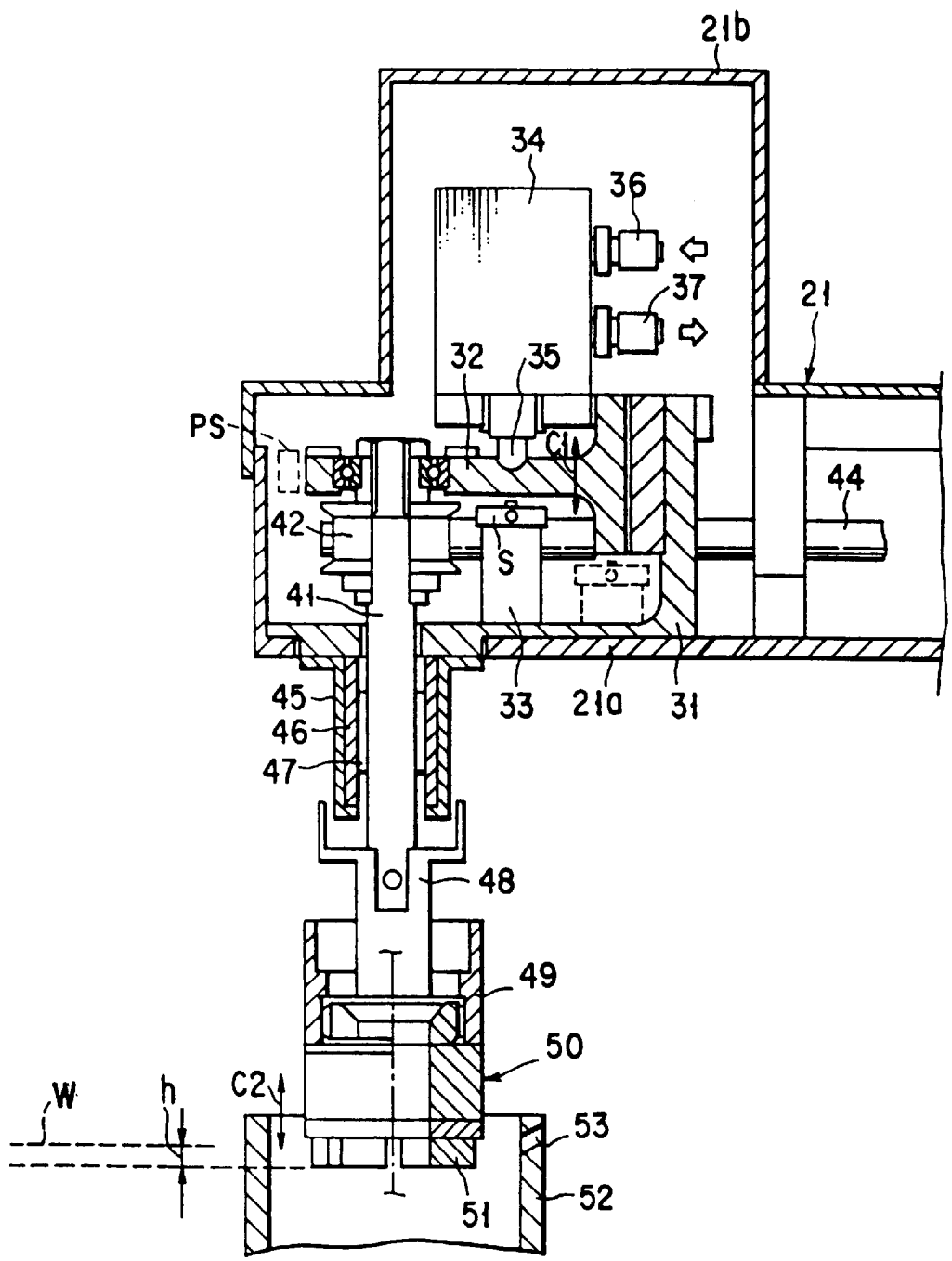
F I G. 3

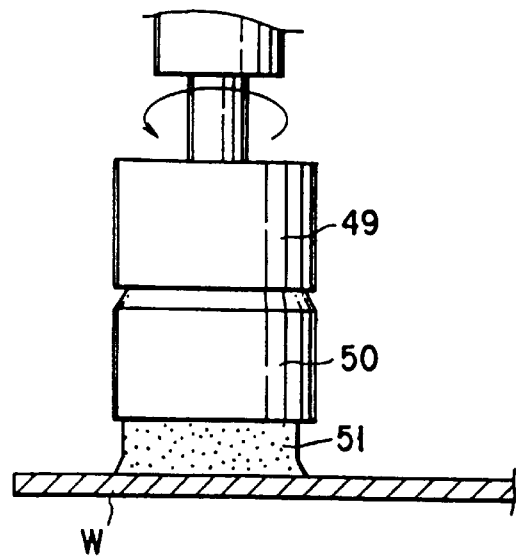
F I G. 4
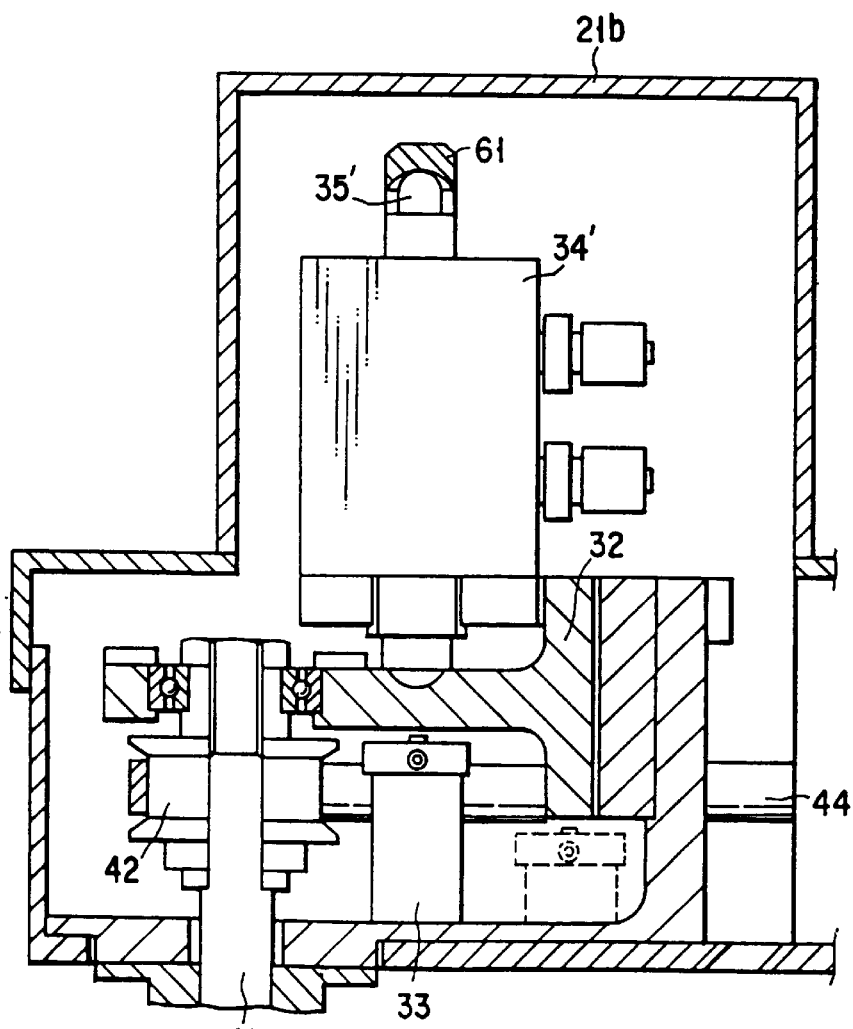
F I G. 5

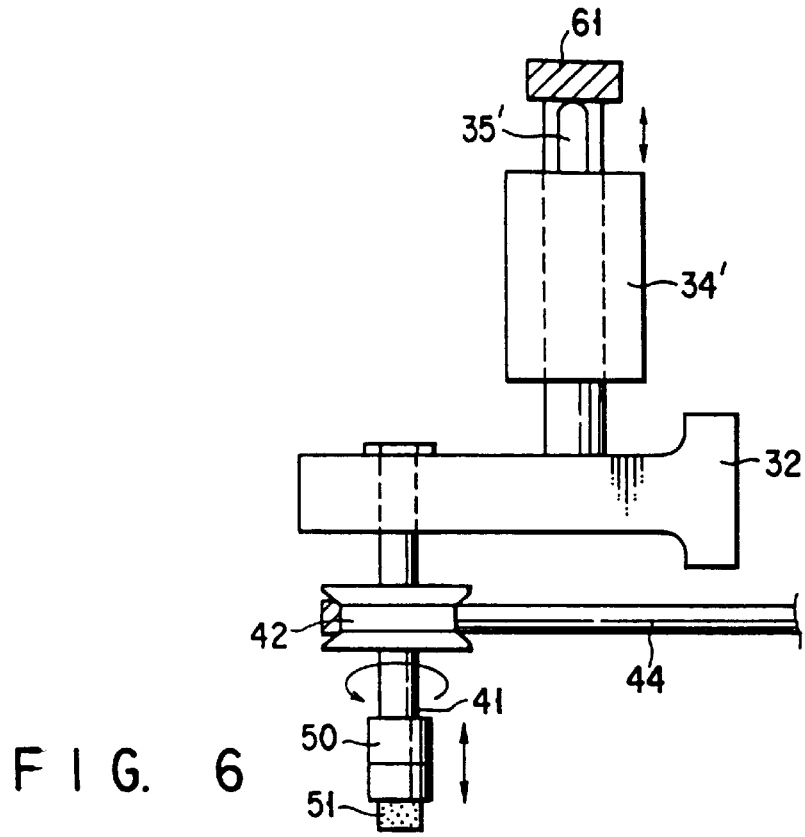
F I G. 6
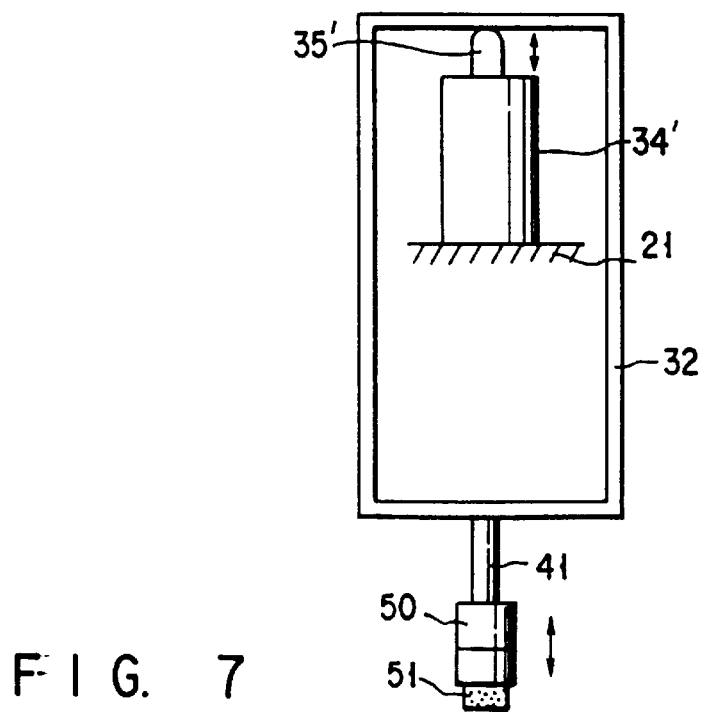
F I G. 7

METHOD OF CLEANING A SUBSTRATE BY SCRUBBING

This is a Division, of application Ser. No. 08/439,570 filed on May 11, 1995, now U.S. Pat. No. 5,636,401.

BACKGROUND OF THE INVENTION

1. Field of the Invention

The present invention relates to a cleaning apparatus and a cleaning method for cleaning an object, such as a semiconductor wafer or an LCD (Liquid Crystal Device) substrate.

2. Description of the Related Art

In a process of manufacturing, for example, a semiconductor device, it is necessary that the surface of a semiconductor wafer (hereinafter abbreviated as a wafer), on which the semiconductor device (e.g., an LSI) is to be formed, be kept strictly clean. For this reason, the surface of a wafer is cleaned, if necessary, before and after each manufacturing process or treatment process. In particular, the photolithography process inevitably requires cleaning of the wafer surface.

Conventionally, the cleaning is performed by a scrub cleaning apparatus as disclosed in Jpn. Pat. Appln. KOKAI Publication No. 57-102024 or 62-259447. In the scrub cleaning apparatus, a cleaning body, such as a rotary brush or sponge, is brought into contact with a surface of an object to be cleaned, so that a foreign substance adhered to the surface can be scrubbed off.

In the scrub cleaning apparatus, a mechanism similar to that for regulating a pressure of a stylus of a record player is employed as a mechanism for bringing the cleaning body to the surface to be cleaned. The mechanism has an arm, one end of which is fixed and the other end of which supports the cleaning body. A balance weight, which is lighter than the total weight of the arm, is mounted on the attachment side (the other end) of the arm, so that a contact pressure can be obtained by the difference between the total weight of the arm and the balance weight.

When the cleaning body is in contact with the surface of the object to be cleaned, the degree of the contact pressure is therefore very important, since if the contact pressure is too high, the surface of the object is damaged, resulting in reduction of the manufacturing yield. Therefore, when the cleaning body is to be brought into contact with the surface of the object to be cleaned, the problem is to what degree the contact pressure is set. In the conventional scrub cleaning apparatus, since the contact pressure cannot be set to a specified value, the cleaning body may damage the object to be cleaned during a scrub cleaning time.

Moreover, as the number of times of cleaning is increased, the elasticity and restorability of the brush or sponge (the cleaning body) is reduced, and the cleaning body is put aside, rimpled or rendered nonuniform in density. As a result, the contact pressure initially set cannot be maintained, and the cleaning cannot be performed sufficiently or uniformly. In this case, the contact pressure should be suitably regulated. However, in the conventional scrub cleaning apparatus, since the contact pressure is regulated by means of the balance weight arranged on the arm, it is necessary to adjust the distance between the balance weight and the fulcrum, every time the contact pressure is to be changed. This adjustment procedure is very difficult.

SUMMARY OF THE INVENTION

An object of the present invention is to provide a cleaning apparatus in which a contact pressure can be set so as not to damage a surface of an object to be cleaned, and a time to exchange a cleaning body can be detected.

This object can be achieved by a cleaning apparatus having object holding means for holding an object to be cleaned such that a surface of the object to be cleaned faces a cleaning body and a cleaning mechanism for moving and rotating the cleaning body for cleaning the surface of the object to be cleaned, wherein the object to be cleaned and the cleaning body are moved relative to each other in a state where the cleaning body is in contact with the surface to the object to be cleaned at a specified contact pressure, thereby cleaning the surface of the object to be cleaned, the cleaning mechanism comprising: a rotatable arm; cleaning body supporting means rotatably supporting a cleaning body; and elevating means, attached to the arm, for moving up and down the cleaning body supporting means.

Another object of the present invention is to provide a cleaning method in which cleaning can be performed with satisfactory follow-up characteristics at a low contact pressure.

This object can be achieved by a cleaning method in which an object to be cleaned is held such that a surface of the object to be cleaned faces a cleaning body and the object to be cleaned and the cleaning body are moved relative to each other in a state where the cleaning body is in contact with the surface to the object to be cleaned, thereby cleaning the surface of the object to be cleaned, wherein a contact pressure of the cleaning body to the surface of the object to be cleaned is set at most 20 gf/cm$^2$ (grams-force/cm$^2$), when the surface is cleaned.

BRIEF DESCRIPTION OF THE DRAWINGS

FIG. 1 is a plan view showing a cleaning apparatus according to the present invention;

FIG. 3 is a longitudinal cross-sectional view showing main part of the cleaning apparatus shown in FIG. 2;

FIG. 4 is a side view showing a state in which a cleaning body is in contact with an object to be cleaned, when the object is cleaned;

FIG. 5 is a longitudinal cross-sectional view showing a cleaning apparatus having a structure for obtaining a contact pressure by a floating system;

FIG. 6 is a diagram for explaining the function of the cleaning mechanism shown in FIG. 5; and FIG. 7 is a diagram for explaining the principle of the cleaning mechanism shown in FIG. 5.

DETAILED DESCRIPTION OF THE PREFERRED EMBODIMENTS

Figure 2:
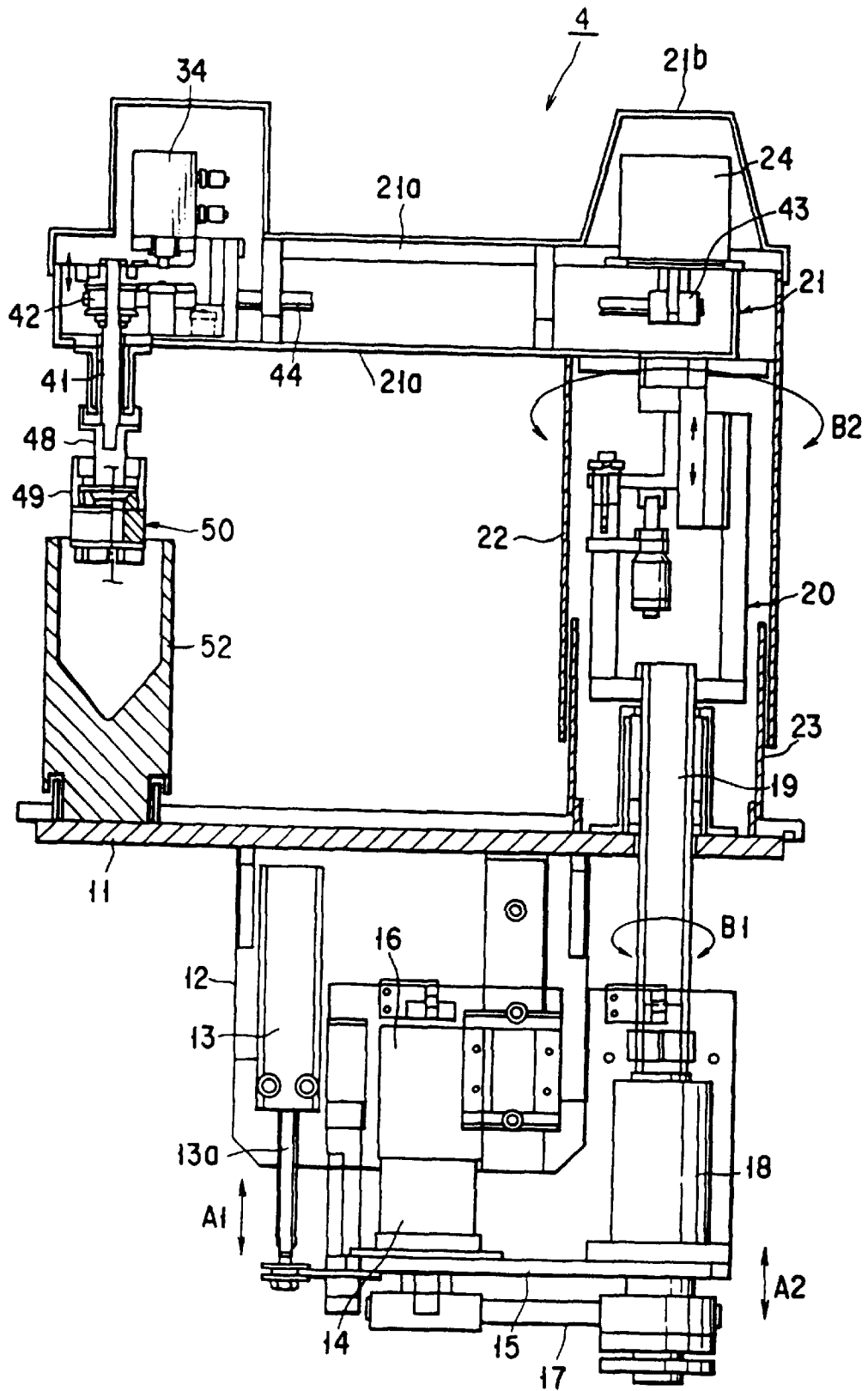
FIG. 2 is a longitudinal cross-sectional view showing a cleaning mechanism of the cleaning apparatus shown in FIG. 1.

The present inventors discovered that an object to be cleaned, such as a wafer, can be cleaned without damage by means of a system for moving up and down a cleaning body alone, so that the cleaning body can be pressed against the object with a relatively small contact pressure, smaller than 60 gf/cm$^2$, preferably smaller than 50 gf/cm$^2$, for example about 30 gf/cm$^2$, unlike in the conventional system in which a cleaning body is pressed against an object to be cleaned by means of a balance weight. The present invention was achieved on the basis of the discovery.

The present invention provides a cleaning apparatus including a cleaning mechanism comprising a rotatable arm;

cleaning body supporting means rotatably supporting a cleaning body; and elevating means, attached to the arm, for moving up and down the cleaning body supporting means.

In the present invention, the cleaning body is a member having a suitable elasticity, such as a brush or sponge, which is brought into contact with the surface of an object to be cleaned, thereby removing a foreign substance adhered to the surface. A wafer or an LCD substrate can be given as an example of the object to be cleaned.

In the cleaning apparatus of the present invention, it is preferable that the cleaning body be moved up and down within a range of at most about 5 mm. If the up and down movement is limited within this range, when rotation of the motor is transferred through a pulley and a belt to the cleaning body, such as a brush or sponge, the cleaning body can be satisfactorily rotated, while the rotation irregularity or failure is suppressed.

Further, since the contact pressure (total contact pressure) of the cleaning body applied to the object to be cleaned is controlled to 60 $gf/cm^2$ or lower, if a wafer is selected as the object to be cleaned, the wafer surface on a device-formed side can be prevented from being damaged by the cleaning body. Moreover, since the cleaning body supporting means is moved up and down, fine control of the contact pressure can easily be performed. In this case, if the contact pressure is 50 $gf/cm^2$ or lower, for example, about 30 gf, a particularly satisfactory cleaning can be achieved.

The contact pressure of the cleaning body applied to the object is set suitably, depending on the kind of the object or the state of the surface of the object to be cleaned; that is, the hardness, material, and form of the object, the cleanness of the surface to be cleaned, the kind of a preprocess, and the tolerance for a flaw. For example, if the surface of an object to be cleaned is the rear surface of a wafer (device non-forming surface), the contact pressure is set to 200 $gf/cm^2$ to 500 $gf/cm^2$, preferably 200 $gf/cm^2$ to 400 $gf/cm^2$, and particularly preferably about 300 $gf/cm^2$. With the contact pressure as mentioned above, if the surface to be cleaned is a device non-forming surface, it can be cleaned without being damaged (flawed).

In the present invention, the elevating means may be means of a cylinder structure in which a piston or the like is slid within a cylinder by fluid such as air or oil. It is preferable that the friction loss of the means is about 1 $gf/cm^2$ or less. With this elevating means, the cleaning body supporting means can be moved up and down in a state where the friction is very little, so that the contact pressure can be fine-controlled with high accuracy.

Further, the present invention provides a cleaning method for cleaning a surface of an object to be cleaned by relatively moving the object to be cleaned and a cleaning body in a state where the object to be cleaned is held such that the surface of the object to be cleaned faces the cleaning body and the cleaning body is in contact with the surface to be cleaned at a contact pressure of 20 $gf/cm^2$ or lower, preferably, 17 $gf/cm^2$ or lower.

Furthermore, the present invention provides a cleaning method, using a cleaning mechanism comprising a rotatable arm; cleaning body supporting means rotatably supporting a cleaning body; and elevating means, attached to the arm, for moving up and down the cleaning body supporting means, for moving up and down the cleaning body supporting means by thrust of the elevating means, thereby pressing the cleaning body to the object to be cleaned at a specified pressure.

With the above methods, the contact pressure of the cleaning body applied to the object to be cleaned can be lowered, if a wafer is selected as the object to be cleaned, the device forming surface of the wafer can be prevented from being damaged by the cleaning body.

In the above methods, it is preferable that the contact pressure be successively detected by a pressure sensor or the like, and the thrust of the elevating means be controlled on the basis of data representing the detected contact pressure. With the control of the thrust of the elevating means, even if the cleaning body is put aside, rimpled or rendered nonuniform in density, the cleaning body can always be pressed to the object to be cleaned at a constant pressure. In addition, since the cleaning body supporting means is moved up and down by controlling the thrust of the elevating means, stable cleaning of a satisfactory follow-up characteristic can be performed. Further, it is unnecessary to adjust the contact pressure every time the object to be cleaned is mounted on the object holding means.

In the above method, it is preferable that the cleaning body be cleaned with a cleaning liquid in a region different from an object cleaning region, for example, in a separate cleaning vessel. In this case, the cleaning body can always be kept clean in a cleaning process. As a result, objects to be cleaned are uniformly cleaned, thereby increasing production yields.

Further, in the above method, it is preferable to detect the time when the contact pressure of the cleaning body applied to the object cannot be kept at a specified value (e.g., 60 $gf/cm^2$ or lower) in a specified elevating range (e.g., 5 mm) determined by the thrust of the elevating means. For example, the pressure sensor for detecting a contact pressure may include means which generate an alarm signal upon detection of the time when the contact pressure cannot be maintained, so that an alarm signal can be generated when the pressure sensor detects that the contact pressure cannot be maintained, in order to inform the time when the cleaning body should be exchanged. As a result, the time to maintain or exchange the cleaning body can easily be informed, so that cleaning failure is prevented and cleaning yields can be improved.

An embodiment of the present invention will be described in detail with reference to the accompanying drawing.

FIG. 1 is a plan view showing a cleaning device of the present invention. In the drawing, a reference numeral 1 denotes a cleaning unit. The cleaning unit 1 has a shutter 2. A wafer W, an object to be cleaned, is transferred into or from the unit through the shutter 2. A cup 3, for preventing cleaning liquid from scattering outside the unit, is arranged in a central portion of the cleaning unit 1. The cup 3 contains a spin chuck (e.g., a vacuum chuck or Bernoulli chuck), which is rotated at a relatively low rate by separately provided rotary driving means (not shown), such as a motor. The wafer W is held by the spin chuck. Cleaning mechanisms, i.e., a body scan arm 4, for moving and rotating a cleaning body for cleaning the wafer W and a mega-sonic jet scan arm 5 for moving a nozzle for jetting cleaning liquid oscillated by ultrasonic waves, are arranged on the respective sides of the cup 3. A rinsing liquid nozzle 6 for supplying rinsing liquid from a position above the wafer W is arranged at a position opposing the shutter 2 in the cleaning unit 1.

The cleaning body scan arm 4 has a structure as shown in FIG. 2. A bracket 12 is adhered to the lower surface of a base 11 which is fixed to the cleaning unit 1. An elevating cylinder 13, including a slidable portion 13a which moves in directions indicated by the arrow $A_1$, is fixed to the bracket 12. As the slidable portion 13a moves up and down (arrow A₁), a supporting plate 15, on which a motor 14 and the like are mounted, is accordingly moved up and down (arrow A₂).

A guide (not shown) is arranged between the supporting plate 15 and the bracket 12 along the vertical direction to perform the up/down movement of the supporting plate 15 stably and smoothly. A casing 16, which is slidable outside the motor 14, is fixed to the bracket 12.

The motor 14 is of a type having a timing mechanism. Rotation of the motor is transferred to a decelerating apparatus 18 mounted on the supporting plate 15 via a transfer member 17 such as a belt. The rotation decelerated by the decelerating apparatus 18 is transferred to a shaft 19. Therefore, the shaft 19 is rotated forward and reverse as indicated by an arrow B1 shown in FIG. 2 in accordance with the forward and reverse rotation of the rotation shaft of the motor 14.

An upper portion of the shaft 19 is inserted through the base 11. A portion near the upper end of the shaft is attached to a lower end portion of a supporting column 20. An upper end portion of the supporting column 20 is adhered to a portion of an arm member 21. The periphery of the shaft 19 and the supporting column 20 is covered by a cylindrical cover 22 attached to the lower surface of a portion of the arm member 21. A cylindrical cover 23, which is slidable with respect to the cover 22, is arranged inside the cover 22. A lower end portion of the cover 23 is fixed to the upper surface of the base 11. Therefore, the arm member 21 is swung in directions indicated by an arrow B₂ shown in FIG. 2 along with the cover 22 in accordance with the forward and reverse rotation (the arrow B₁) of the shaft 19. For example, the arm member 21 is constructed so as to be swung within a predetermined range above the wafer W, as indicated by an arrow shown in FIG. 1, in accordance with a program prestored in a memory.

The arm member 21 has a frame 21a and a cover 21b. A motor 24, for rotating a cleaning body 51 (to be described later), is attached to the lower surface of the cover 21b. As shown in FIG. 3, a supporting member 31 is fixed to the frame 21a near the other end portion of the arm member 21. One end portion of a slidable body 32 is attached to one side of the supporting member 31 so as to be moved up and down with respect to the supporting member 31. The lower surface of the slidable body 32 abuts on a pressure sensor S mounted on the upper surface of a supporting member 33 on the frame 21a, so that a downward pressure of the slidable body 32 can be measured.

An air cylinder 34 fixed to the frame 21a is arranged in the arm member. A slidable member 35 for moving the slidable body 32 up and down is attached to the lower surface of the air cylinder 34. The slidable member 35 is constructed so that the thrust can be desirably controlled by air supply through a supplying portion 36 and air exhaust through an exhausting portion 37. Therefore, the slidable body 32 is moved up and down in directions indicated by an arrow C₁ shown in FIG. 3 in accordance with the up and down movement of the slidable member 35. The friction loss of the slidable member 35 of the air cylinder 34 is 1 gf/cm² or less, which is considerably less than the friction loss 150 gf/cm² according to the conventional method. A distal end portion of the slidable member 35 may abut on the slidable body 32 so as to press the slidable body 32 downward at a constant pressure. As described above, the cleaning apparatus of the present invention has a structure different from that of the conventional cleaning apparatus, in which the cleaning body alone is moved up and down at a distal end portion of the arm member 21, i.e., an end portion to which the cleaning body is attached.

An upper end portion of a shaft 41 is rotatably supported by the other end portion of the slidable body 32. A lower end portion of the shaft 41 protrudes downward under the arm member 21. A driven pulley 42 is adhered to a portion near the upper end of the shaft 41. A belt 44 is arranged across the driven pulley 42 and a driving pulley 43 attached to the shaft of the motor 24. Rotation of the motor is thus transferred to the shaft 41 through the belt 44, with the result that the shaft 41 is rotated at a relatively high rate.

A shaft cover 45 is arranged around the protruded portion of the shaft 41. A ball bearing 47 is provided inside the shaft cover 45 via a spacer 46, so that the ball bearing 47 supports the periphery of the shaft 41. A cleaning member 50 is detachably attached to a lower end portion of the shaft 41 via a dustproof body 48 and an attachment member 49. The dustproof body 48 has an opened upper surface to prevent dust or particles generated within the shaft cover 45 from falling down and restricts the range of the up and down movement of the shaft 41 together with the lower end of the shaft cover 45.

In this embodiment, a substantially cylindrical sponge member, serving as a cleaning body 51, is attached to the cleaning member 50 fit to the lower portion of the attachment member 49. A hard brush, such as a nylon brush having bristles, or a soft brush, such as a mohair brush having soft hairs, can be used as the cleaning body 51, instead of the sponge member, depending on the kind of the object to be cleaned.

With the structure as described above, when the slidable member 32 is moved up and down (the arrow C₁ in FIG. 3) by means of the air cylinder 34, the cleaning member 50 is moved up and down in the directions indicated by an arrow C₂. In this embodiment, the range of the up and down movement is set to 5 mm or smaller.

A cleaning vessel 52 having an opened upper surface is mounted on a portion of the upper surface of the base 11 under the cleaning member 50. In a normal state, i.e., a state as shown in FIGS. 2 and 3, the cleaning body 51 attached to the lower surface of the cleaning member 50 can enter the cleaning vessel 52. In this state, a suitable cleaning liquid, for example, pure water is jetted to the cleaning body 51 from a separate cleaning liquid jetting apparatus (not shown) through a jet port 53 formed in a wall of the cleaning vessel 52. In the state shown in FIG. 3, i.e., the normal state, the level of the lower surface of the cleaning body 51 is set 2 to 3 mm lower than the upper surface of the wafer W placed on the spin chuck. In FIG. 3, h=2 to 3 mm.

A case of scrub cleaning of the main surface of the wafer W, i.e., the device forming surface, using the cleaning unit 1, will be described below.

First, in the state shown in FIG. 2, the elevating cylinder 13 is operated, so as to move up the slidable portion 13a and lift the arm member 21, thereby moving the cleaning member 50 up from the cleaning vessel 52. In this state, the motor 14 is operated to swing the arm member 21 and move it to a predetermined position, e.g., the center, of the wafer W.

Subsequently, while the motor 24 is operated to rotate the cleaning member 50 at a high speed, the slidable portion 13a of the elevating cylinder 13 is lowered to a predetermined position, so that the cleaning body 51 of the cleaning member 50 is brought into contact with the main surface of the wafer W. In this state, the air cylinder 34 is operated, thereby obtaining a predetermined contact pressure of the cleaning body 51 applied to the main surface of the wafer W, as shown in FIG. 4. In this case, the contact pressure is set to about 30 gf/cm² by controlling the air cylinder 34. The contact pressure can be automatically set by employing a structure in which the air cylinder is controlled by a detection signal output from the pressure sensor S. For example, in FIG. 2, in a standby state in which the slidable portion 13a is lowered, the pressure of the slidable member 32 in the lowered state is measured by the pressure sensor S. The measured value is the sum of the self-weight applied to the slidable member 32 and the pressing force by the air cylinder 34 and it corresponds to the contact pressure. Therefore, the contact pressure can be set to a predetermined value by controlling the pressing force of the air cylinder 34.

The contact pressure can be automatically set in accordance with the up and down movement of the cleaning member 50 by programming the contact pressure in advance using a dummy wafer. The contact pressure is thereafter detected by the pressure sensor S in the standby state, thereby automatically setting the contact pressure only with fine control, if necessary.

While the cleaning body 51 having the contact pressure set as described above is rotated at a high speed and the arm member 21 is rotated in a reciprocating manner within the range indicated by the arrow shown in FIG. 1, a suitable cleaning liquid, for example, pure water, is supplied to the cleaning body 51. As a result, the overall surface of the wafer W is scrubbed. During the cleaning, the slidable member 32, i.e., the cleaning member 50, is movable with respect to the supporting member 31 upward and downward in the directions indicated by the arrow $C_1$. Even if the cleaning member 50 is moved up and down, the pressing force of the air cylinder 34 remains constant. Thus, the contact pressure can be set constant. In this case, since the contact pressure of the cleaning body 51 to the main surface of the wafer W is set to a low value of 30 $gf/^2$, the cleaning body 51 does not damage the main surface of the wafer W and sufficiently clean the surface.

When the cleaning is completed in the manner as described above, the arm member 21 is moved upward by an operation of the elevating cylinder 13. Subsequently, the arm member 21 is swung away by the operation of the motor 14, so that the cleaning member 50 is returned to the position above the cleaning vessel 52. Then, the cleaning member 50 is moved down and the cleaning body 51 is received in the cleaning vessel 52. In this state, a cleaning liquid, such as pure water, is jet to the cleaning body 51 from the separate cleaning liquid jetting apparatus (not shown). In other words, the cleaning body 51 itself is subjected to cleaning and maintained in a cleaned state. Therefore, a next wafer W can be cleaned with the cleaning body 51 always kept clean.

The cleaned wafer w is transferred to another unit by a separate transfer apparatus (not shown). Another wafer W to be cleaned is held on the spin chuck and the same cleaning process as described above is repeated.

As the cleaning process is repeated, since a predetermined load is applied to the cleaning body 51, the elasticity or restorability thereof is reduced. If the cleaning process is repeated in a state where the elasticity and restorability of the cleaning body 51 is reduced, the contact pressure of the cleaning body 51 to the object to be cleaned may be changed, with the result that an expected cleaning effect cannot be obtained, or an excessive contact pressure may be applied to the object to be cleaned and damage the wafer W. In this case, with the cleaning unit 1 of this embodiment, since the contact pressure is continuously monitored by the pressure sensor S, the air cylinder 34 can be controlled to a predetermined contact value on the basis of a detection signal output from the pressure sensor S. As a result, the contact pressure is kept constant. Even if the elasticity or the restorability is reduced, an expected cleaning effect can be obtained under the constant contact pressure. Therefore, even when the number of cleaning times is increased, the object to be cleaned is not damaged, and a cleaning process of extremely high yields can be executed.

When the cleaning process is repeated and the elasticity or restorability of the cleaning body 51 is considerably reduced, with the result that a predetermined contact pressure cannot be obtained in the aforementioned slidable range of 5 mm, it is desirable that the cleaning body 51 itself be exchanged. In this case, the time to maintain or exchange the cleaning body 51 can be recognized in advance by providing an apparatus for detecting that the elasticity of restorability of the cleaning body 51 is considerably reduced and generating an alarm signal. With this apparatus, it is possible to prevent an accident such as damage of the object to be cleaned or reduction of the cleaning effect. For example, when the elasticity or restorability of the cleaning body 51 is reduced and the slidable member 32 is lowered to obtain the predetermined contact pressure, a position sensor PS of a photoelectric type or the like, arranged beside the slidable body 32, detects that the slidable member 32 abuts on the pressure sensor S, thereby preventing the slidable body 32 from excessively lowering during the cleaning process.

Since the slidable range of the slidable body 32 supporting the shaft 41 is set to 5 mm or smaller in the above cleaning unit 1, even if the slidable member 35 of the air cylinder 34 is slid to regulate the contact pressure, the positional relationship between the belt 44 and the driven pulley 42 will not be changed excessively. Therefore, the rotation of the shaft 41 is not disturbed and the rotation force is efficiently transferred to the shaft 41 without loss. Thus, even when the cleaning process is repeated a number of times, uniform cleaning can be executed, thereby obtaining a constant cleaning quality without variance in objects to be cleaned.

In the above embodiment, since the surface to be cleaned is the main surface of the object to be cleaned, i.e., the device forming surface of the wafer W, the contact pressure is set to 30 $gf/cm^2$. However, if the surface to be cleaned is the rear surface, i.e., the device non-forming surface of the wafer W, the contact pressure may be set to 20 $gf/cm^2$ to 1 $kgf/cm^2$, preferably 200 $gf/cm^2$ to 400 $gf/cm^2$, particularly preferably about 300 $gf/cm^2$, in a case where the cleaning body 51 is a sponge made of PVA (polyvinylalchol). In this case, a sufficient cleaning effect can be obtained without damaging the rear surface.

In general, it is necessary to clean the main and rear surfaces, i.e., both the device forming surface and the device non-forming surface of the object to be cleaned (e.g., a wafer W). In this case, as described above, the contact pressure of the cleaning body 51 to the surface to be cleaned can be different in a case of cleaning the main surface of the wafer and a case of cleaning the rear surface thereof. In this manner, an effective cleaning can be executed without damaging the surface.

Therefore, for example, a composite cleaning apparatus of a so-called hybrid type having two types of cleaning units can be used: one has a contact pressure for the device forming surface; and the other has a contact pressure for the device non-forming surface, so that the one cleaning unit cleans only the device forming surface and the other cleaning unit cleans only the device non-forming surface. With this apparatus, the object can be cleaned particularly efficiently and effectively. In this case, a transporting device, for turning the object over during transportation and transporting it, may be arranged between holding devices, for example, spin chucks of the respective cleaning units. As result, both surfaces of the object can be continuously cleaned.

In the above embodiment, the air cylinder 34 of the cleaning unit 1 has a structure in which the slidable member 35 presses the slidable body 32 downward from an upper portion to obtain a predetermined contact pressure. However, as shown in FIG. 5, a slidable member 35' may be arranged above an air cylinder 34', so that a pressed portion 61 formed integrally with the slidable body 32 can be moved up and down by means of the slidable member 35'. With this structure, the contact pressure of the cleaning body 51 applied to the wafer W can be obtained only by regulating the thrust in vertical directions of the slidable member 35' of the air cylinder 34. In other words, the slidable body 32 is in a floating state as shown in FIG. 7. Therefore, to obtain a predetermined contact pressure, it is only necessary that the air cylinder 34' obtains thrust by subtracting a predetermined contact pressure load from the self-weight of the cleaning member 50 including the slidable body 32 and the driven pulley 42. The system can be controlled more easily and the fine control can be easily executed. Therefore, it is suitable for cleaning of a so-called device forming surface with a small contact pressure.

The above embodiments are applied to cases in which a wafer W is used as an object to be cleaned. However, an LCD substrate may be used as an object to be cleaned. Further, from a viewpoint of the function and effect of the present invention, i.e., to bring a brush or sponge into contact with a surface of an object to be cleaned so as not to damage the surface, the present invention can be applied not only to a cleaning method and apparatus but also to, for example, a method and apparatus for applying a solution to a surface of an object to be processed.

As has been described above, the present invention includes a cleaning mechanism comprising a rotatable arm; cleaning body supporting means rotatably supporting a cleaning body; and elevating means, attached to the arm, for moving up and down the cleaning body supporting means. According to this mechanism, the cleaning body can be uniformly brought into contact with the object to be cleaned to satisfactorily clean the object without taking the horizontality or camber of the arm into consideration. In other words, according to the cleaning apparatus of the present invention, since the contact pressure of the cleaning body applied to the object to be cleaned is controlled by the up and down movement of the cleaning body supporting member, it is possible to easily control a small contact, which has not easily been controlled by the conventional apparatus. As a result, the object can be cleaned with satisfactory follow-up characteristics of the cleaning body without damage of the surface of the object to be cleaned. Further, according to the cleaning method of the present invention, the time to exchange the cleaning body can be detected definitely, so that a cleaning process of extremely high yields can be executed without damage of the object to be cleaned.

What is claimed is:

1. A cleaning method in which an object to be cleaned is held such that a surface of the object to be cleaned faces a cleaning body and the object to be cleaned and the cleaning body are moved relative to each other in a state where the cleaning body is in contact with the surface to the object to be cleaned, thereby cleaning the surface of the object to be cleaned, using a mechanism comprising: a rotatable arm; cleaning body supporting means rotatably supporting a cleaning body; and elevating means, attached to the arm, for moving up and down the cleaning body supporting means, wherein the cleaning body supporting means is moved up and down by thrust of the elevating means, so that the cleaning body is pressed to the object at a specified contact pressure;

comprising the step of consecutively detecting the contact pressure and controlling the thrust of the elevating means on the basis of data of the detected contact pressure; and further comprising the step of detecting a time when the specified contact pressure of the cleaning body to the object to be cleaned cannot be maintained by the thrust of the elevating means.

2. The method according to claim 1, comprising the step of cleaning the cleaning body with a cleaning liquid during a standby state between cleaning process.

3. A method for scrubbing a substrate clean comprising:

(a) a step of preparing means for supplying cleaning liquid to a surface of the substrate to be cleaned, a scrubbing member capable of being in contact with the surface of the substrate to be cleaned, means for moving along the surface the scrubbing member relative to the surface of the substrate to be cleaned, a vertical shaft supporting the scrubbing member, means for moving the vertical shaft up and down, a horizontal arm having a proximal end and a free end which is connected to the vertical shaft, an arm supporting column having an upper end which is connected to the proximal end of the horizontal arm, and means for moving the arm supporting column up and down;

(b) a step of holding the substrate such that the surface of the substrate to be cleaned is kept substantially horizontal;

(c) a step of causing the scrubbing member to face the surface of the substrate to be cleaned;

(d) a step of spinning the substrate and supplying the cleaning liquid to the substrate;

(e) a first adjustment step of carrying out coarse control of a contact pressure of the scrubbing member to the substrate by moving the arm supporting column up and down, when the scrubbing member is pressed to the surface of the substrate to be cleaned, while rotating around a rotation axis; and (f) a second adjustment step of carrying out fine control of the contact pressure of the scrubbing member to the substrate by moving the vertical shaft up and down so as to be set to at most 20 $gf/cm^2$; and (g) a step of consecutively detecting the contact pressure and controlling the thrust of the vertical shaft moving means on the basis of data of the detected contact pressure; and (h) a step of detecting a time when the specified contact pressure of the scrubbing member to the substrate to be cleaned cannot be maintained by the thrust of the vertical shaft means.

4. A method for scrubbing a substrate clean comprising:

(a) a step of preparing means for supplying cleaning liquid to a surface of the substrate to be cleaned, a scrubbing member capable of being in contact with the surface of the substrate to be cleaned, means for moving along the surface the scrubbing member relative to the surface of the substrate to be cleaned, a vertical shaft supporting the scrubbing member, means for moving the vertical shaft up and down, a horizontal arm having a proximal end and a free end which is connected to the vertical shaft, an arm supporting column having an upper end which is connected to the proximal end of the horizontal arm, and means for moving the arm supporting column up and down;

(b) a step of holding the substrate such that the surface of the substrate to be cleaned is kept substantially horizontal;

(c) a step of causing the scrubbing member to face the surface of the substrate to be cleaned;

(d) a step of spinning the substrate and supplying the cleaning liquid to the substrate;

(e) a first adjustment step of carrying out coarse control of a contact pressure of the scrubbing member to the substrate by moving the arm supporting column up and down, when the scrubbing member is pressed to the surface of the substrate to be cleaned, while rotating around a rotation axis;

(f) a step of setting a specified contact pressure at which the scrubbing member begins to damage the surface of the substrate to be cleaned;

(g) a step of detecting the contact pressure of the scrubbing member to the substrate at the vertical shaft; and (h) a second adjustment step of carrying out fine control of the contact pressure of the scrubbing member to the substrate by controlling thrust of the means for moving the vertical shaft up and down when the contact pressure detected in the step (g) exceeds the specified contact pressure set in the step (f).

5. The method according to claim 4, wherein in the step (f), the specified contact pressure at which the scrubbing member begins to damage the surface of the substrate to be cleaned is set by using a dummy wafer.

* * * * *